(12) United States Patent
Namba

(10) Patent No.: US 7,202,632 B2
(45) Date of Patent: Apr. 10, 2007

(54) BATTERY MANAGEMENT APPARATUS

(75) Inventor: Atsushi Namba, Tokyo (JP)

(73) Assignee: Fuji Jukogyo Kabushiki Kaisha, Tokyo (JP)

( * ) Notice: Subject to any disclaimer, the term of this patent is extended or adjusted under 35 U.S.C. 154(b) by 8 days.

(21) Appl. No.: 11/347,325

(22) Filed: Feb. 6, 2006

(65) Prior Publication Data

US 2006/0176022 A1  Aug. 10, 2006

(30) Foreign Application Priority Data

Feb. 7, 2005  (JP) ............................. 2005-030987

(51) Int. Cl.
*H02J 7/00* (2006.01)
*H02J 7/04* (2006.01)
*G01N 27/416* (2006.01)

(52) U.S. Cl. ...................... 320/132; 320/150; 324/431; 324/432; 324/433

(58) Field of Classification Search ................ 320/132, 320/150; 702/63; 324/431–433
See application file for complete search history.

(56) References Cited

U.S. PATENT DOCUMENTS 5,539,318 A    7/1996  Sasaki ......................... 324/428
6,114,838 A *  9/2000  Brink et al. ................. 320/136
6,850,038 B2 * 2/2005  Arai et al. ................... 320/132
2003/0067282 A1* 4/2003  Arai et al. ................... 320/132

FOREIGN PATENT DOCUMENTS

JP         06-242193        9/1994

* cited by examiner

*Primary Examiner*—Gary L. Laxton
*Assistant Examiner*—Yalkew Fantu
(74) *Attorney, Agent, or Firm*—Smith, Gambrell & Russell LLP

(57) ABSTRACT

When impedance calculating conditions are satisfied after a system is started, the impedance of a battery is calculated using the current of the battery, a time variation in open circuit voltage thereof, a time variation in terminal voltage thereof, a time variation in current thereof, and a time variation in impedance thereof. The ratio of the calculated impedance to the initial impedance is calculated. The impedance ratio is subjected to weighting and averaging, thus obtaining a weighted average. When the system is terminated, an impedance-correction-coefficient learned value is updated using the weighted average. Thus, a change in impedance of the battery can be accurately grasped. Advantageously, parameters indicating the state of the battery, e.g., the remaining capacity thereof, reflect the change in impedance, resulting in accurate battery management.

14 Claims, 7 Drawing Sheets

| T\kΔI/Δt | 0 | 5 | 10 | 40 | 50 |
|---|---|---|---|---|---|
| -30 | *.*** | *.*** | *.*** | *.*** | *.*** |
| -20 | *.*** | *.*** | *.*** | *.*** | *.*** |
| -10 | *.*** | *.*** | *.*** | *.*** | *.*** |
| 0 | *.*** | *.*** | *.*** | *.*** | *.*** |
| 10 | *.*** | *.*** | *.*** | *.*** | *.*** |
| 25 | 0.0057 | 0.0057 | 0.0035 | 0.0032 | 0.0031 |
| 40 | *.*** | *.*** | *.*** | *.*** | *.*** |
| 50 | *.*** | *.*** | *.*** | *.*** | *.*** |

| kΔI/Δt | 0 | 3 | 10 | 20 | 50 |
|---|---|---|---|---|---|
| w | 0.999 | 0.9995 | 0.9998 | 1 | 1 |

FIG.8

| T\SOCv (%) | 0 | 10 | 20 | 30 | 40 | 50 | 60 | 70 | 80 | 90 | 100 |
|---|---|---|---|---|---|---|---|---|---|---|---|
| -30 | **** | **** | **** | **** | **** | **** | **** | **** | **** | **** | **** |
| -20 | **** | **** | **** | **** | **** | **** | **** | **** | **** | **** | **** |
| -10 | **** | **** | **** | **** | **** | **** | **** | **** | **** | **** | **** |
| 0 | **** | **** | **** | **** | **** | **** | **** | **** | **** | **** | **** |
| 10 | **** | **** | **** | **** | **** | **** | **** | **** | **** | **** | **** |
| 25 | **** | **** | **** | **** | **** | 298.96 | 308.81 | 317.21 | 324.31 | **** | **** |
| 40 | **** | **** | **** | **** | **** | **** | **** | **** | **** | **** | **** |
| 50 | **** | **** | **** | **** | **** | **** | **** | **** | **** | **** | **** |

Vo

BATTERY MANAGEMENT APPARATUS

CROSS REFERENCES TO RELATED APPLICATIONS

This application claims benefit of Japanese Application No. 2005-30987 filed on Feb. 7, 2005, the contents of which are incorporated by this reference.

BACKGROUND OF THE INVENTION

1. Field of the Invention

The present invention relates to a battery management apparatus for grasping a change in impedance of a battery caused by the deterioration of the battery to reflect the change in battery management.

2. Description of the Related Art

In the field of vehicles, such as automobiles, to encourage low emission and resource saving, the development of hybrid electric vehicles is advancing. Emissions from hybrid electric vehicles are substantially lower than vehicles using a gasoline-powered engine and the hybrid electric vehicles ensure resource saving. A hybrid electric vehicle mounts a gasoline-powered engine and a motor which generates driving power using electric power supplied from a battery and operates using both the engine and the motor. In the above-mentioned hybrid electric vehicles, grasping the accurate battery state to manage the battery is of importance. For this purpose, the remaining capacity of the battery is calculated in addition to basic parameters, such as voltage, current, and temperature. The remaining capacity is affected by the deterioration of the battery. Disadvantageously, it is difficult to maintain high accuracy with which to calculate the remaining capacity over the long term.

Japanese Unexamined Patent Application Publication No. 6-242193 (Patent Document 1) discloses a technique of obtaining the remaining capacity of a battery on the basis of its open circuit voltage obtained from the battery voltage measured when an electric vehicle stops, detecting the discharged capacity based on the integrated value of the discharge current of the battery, calculating the fully-charged capacity on the basis of the discharged capacity and the remaining capacity at the stop time, and calculating the degree of deterioration on the basis of the fully-charged capacity and the nominal fully-charged capacity, thus detecting the remaining capacity in consideration of the degree of deterioration.

According to the technique disclosed in Patent Document 1, the open circuit voltage is obtained based on the battery voltage measured when the vehicle stops. Disadvantageously, the open circuit voltage is obtained with no consideration given to the following fact: As the battery deteriorates, the internal impedance thereof increases, so that the open circuit voltage is affected. In addition, in electric vehicles, even when its motor stops, current flows in a load, e.g., an inverter. Accordingly, the accurate open circuit voltage is not always detected. Therefore, the technique of Patent Document 1 is of limited application. It is insufficient to manage the state of a battery according to various mounting conditions.

SUMMARY OF THE INVENTION

Accordingly, it is an object of the present invention to provide a battery management apparatus capable of accurately grasping a change in impedance of a battery to reflect the change in battery management.

In brief, according to the present invention, there is provided a battery management apparatus including: an impedance calculating unit for calculating the impedance of a battery using the terminal voltage of the battery, the open circuit voltage thereof, and the current thereof as parameters when a variation in current of the battery and the temperature thereof are respectively within predetermined ranges; and an impedance correction value calculating unit for comparing the impedance obtained by the impedance calculating unit with an initial impedance previously obtained from the initial state of the battery to calculate an impedance correction value depending on the degree of deterioration of the battery.

Other features and advantages of the present invention will become more apparent from the following description.

BRIEF DESCRIPTION OF THE DRAWINGS

FIG. 8 is a table explaining the remaining capacity table;

DESCRIPTION OF THE PREFERRED EMBODIMENTS

Figure 1:
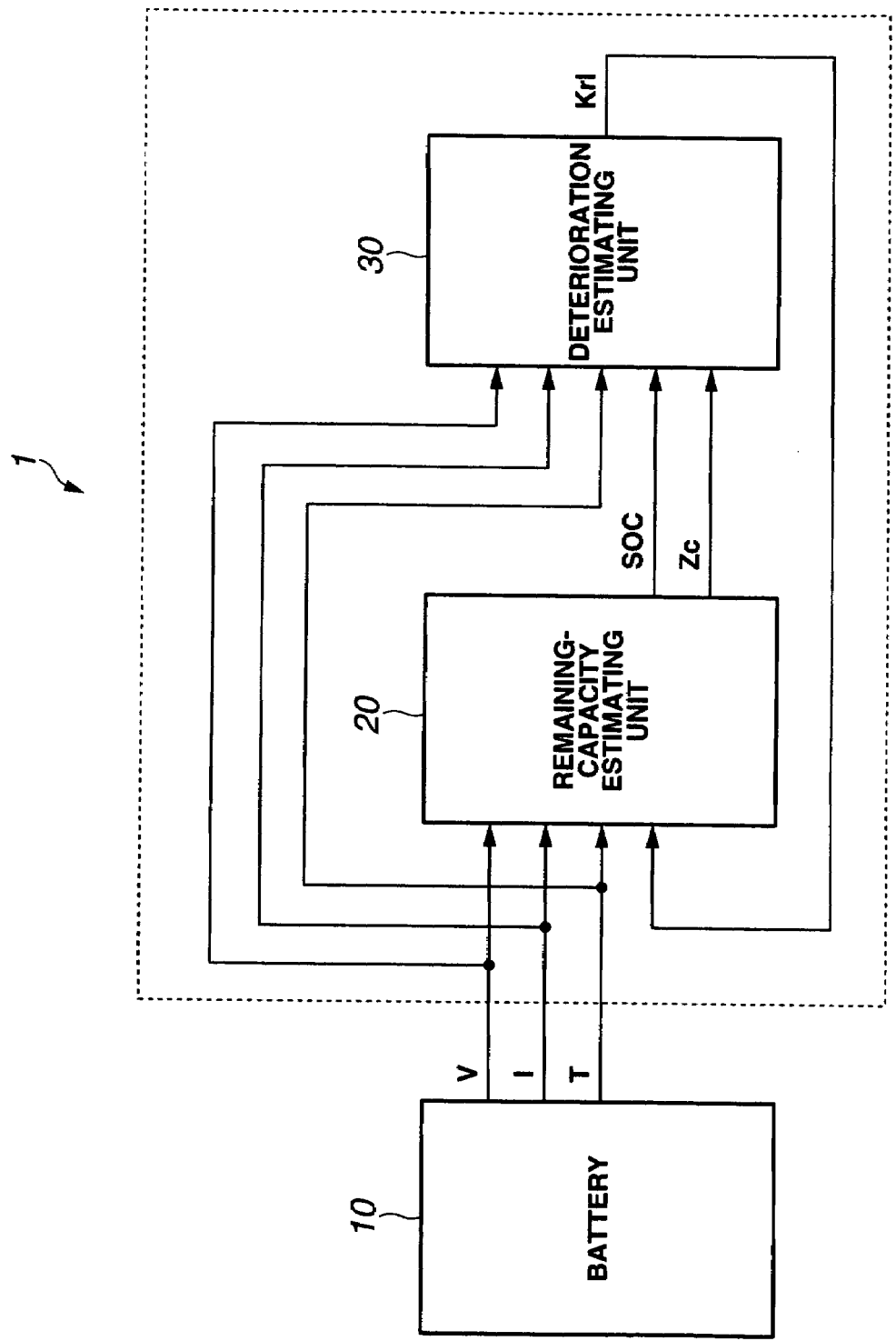
FIG. 1 is a block diagram of a battery management apparatus according to an embodiment of the present invention.

FIG. 1 shows a battery management apparatus 1 according to an embodiment of the present invention. The battery management apparatus 1 is mounted as an on-board device on, e.g., an engine-powered vehicle, a hybrid electric vehicle with the combination of an engine and a motor, or an electric motor-powered vehicle. The battery management apparatus 1 reflects the state of a battery 10 grasped in an on-board manner in operations, e.g., controlling cooling or charging the battery 10, detecting malfunction, and performing the protecting operation upon detecting malfunction. According to the present embodiment, the battery management apparatus 1 includes a remaining-capacity estimating unit 20 and a deterioration estimating unit 30. The remaining-capacity estimating unit 20 calculates and estimates the state of charge (SOC), i.e., the remaining capacity SOC of the battery 10. The deterioration estimating unit 30 estimates the degree of deterioration of the battery 10.

In the present embodiment, a description will be made on the assumption that a lithium-ion secondary battery is used as the battery 10 and the battery is composed of a plurality of multi-sealed-cell battery packs connected in series. The present invention can also be applied to other secondary batteries and capacitors.

The remaining-capacity estimating unit 20 and the deterioration estimating unit 30 are provided as functional units of a single apparatus including a microcomputer. Alternatively, the units 20 and 30 may be provided as individual devices each including a microcomputer. The units 20 and 30 learn the rate of increase in impedance depending on the deterioration of the battery 10 in an on-board manner and reflect the rate in battery management.

The impedance Z of the battery 10 can be expressed by the relation between the terminal voltage V of the battery 10, the open circuit voltage Vo thereof, and the current I thereof as shown in the following Expression (1). The discharge side of the current I is assumed as a positive value.

$$V = Vo - I \times Z \quad (1)$$

When Expression (1) is differentiated with respect to time, the following Expression (2) is obtained. As shown in Expression (3) derived from Expression (2), the impedance Z can be calculated from the time-differential open circuit voltage Vo, the time-differential terminal voltage V, the time-differential current I, and the time-differential impedance Z.

$$dV/dt = dVo/dt - (dI/dt \times Z + dZ/dt \times I) \quad (2)$$

$$Z = (dVo/dt - dV/dt - dZ/dt \times I)/(dI/dt) \quad (3)$$

The time-differential open circuit voltage Vo, the time-differential terminal voltage V, the time-differential current I, and the time-differential impedance Z in Expression (3) are obtained as discrete time differences and the discrete time differences are set to a variation in open circuit voltage over time DVOC, a variation in terminal voltage over time DVB, a variation in current over time DIB, and a variation in impedance over time DZ. Hereinafter, the term "variation in open circuit voltage over time DVOC" is referred to as "time variation in open circuit voltage DVOC", the term "variation in terminal voltage over time DVB" is referred to as "time variation in terminal voltage DVB", the term "variation in current over time DIB" is referred to as "time variation in current DIB", and the term "variation in impedance over time DZ" is referred to as "time variation in impedance DZ". Then, Expression (3) can be expressed by the following Expression (4).

$$Zn = (DVOC - DVB - DZ \times I)/DIB \quad (4)$$

When conditions where the temperature T of the battery 10 and the time variation in current DIB are respectively within predetermined ranges (e.g., the temperature T is in the range of 30 to 40° C. and the time variation in current DIB is in the range of 40 to 60 A/s) are satisfied, the deterioration estimating unit 30 starts the control operation as impedance calculating means. In the impedance calculation control, the respective time variations DVOC, DVB, DIB, and DZ are obtained on the basis of the terminal voltage V of the battery 10, the current I, the temperature T, the remaining capacity SOC calculated by the remaining-capacity estimating unit 20, and an impedance Zc (corrected impedance which will be described below) used upon calculating the remaining capacity. According to Expression (4), an impedance Zn is calculated.

The impedance Zn calculated according to Expression (4) is compared to a previously stored initial impedance Zi, which is obtained under the same conditions as the above-mentioned impedance calculating conditions by a function, serving as impedance correction value calculating means, when the battery is in the initial state (i.e., it does not deteriorate). Thus, an impedance-correction-coefficient learned value Krl is calculated as a correction value indicating the rate of increase in impedance depending on the deterioration of the battery.

Specifically, as shown by the following Expression (5), the impedance ratio Krz of the calculated impedance Zn to the initial impedance Zi is obtained. Then, a weighted average Krc is calculated from the impedance ratio Krz as shown by the following Expression (6). Upon terminating the whole operation of a system which leads to the termination of a process of the battery management apparatus 1, the weighted average Krc is stored as the impedance-correction-coefficient learned value Krl on a memory. The learned value is used to correct the impedance depending on the deterioration of the battery.

$$Krz = Zn/Zi \quad (5)$$

$$(Krz > 1)$$

$$Krc = (1-a) \times Krc + a \cdot Krz \quad (6)$$

(a: Weight of weighted average [0<a<1, e.g., a=1/256])

The initial value of the weighted average Krc corresponds to the impedance-correction-coefficient learned value Krl and the initial value of the impedance-correction-coefficient learned value Krl is set to 1.

In this case, the impedance may be calculated every region. A plurality of regions are set based on the time variation in current DIB and the temperature T. The impedance calculation control every region is performed to divide the above-mentioned impedance calculating conditions into condition segments in order to increase the number of correction, thus grasping the degree of deterioration of the battery with higher accuracy. When the battery temperature T and the time variation in current DIB are within the above-mentioned predetermined ranges, the range of the temperature T or that of the time variation in current DIB is divided into regions. The impedance is calculated every region.

Let j (j=1 to n) be the number of regions where the impedance is calculated. The battery current I, the time variation in open circuit voltage DVOC, the time variation in terminal voltage DVB, the time variation in current DIB, and the time variation in impedance DZ are obtained every region. The impedance znj for each region is calculated by the following Expression (4') obtained by applying Expression (4) to the calculation every region.

$$Znj = (DVOC - DVB - DZ \times I)/DIB \quad (4')$$

As shown in the following Expression (5'), the impedance ratio Krzj of the impedance Znj to the initial impedance Zi is calculated. After that, as shown in the following Expression (6'), a weighted average Krc of the impedance ratio Krzj is obtained every region. The initial value of the weighted average Krc is set to the impedance-correction-coefficient learned value Krl and the initial value of the impedance-correction-coefficient learned value Krl is set to 1.

$$Krzj = Znj/Zi \quad (5')$$

$$(Krzj > 1)$$

$$Krcj = (1-a) \times Krcj + a \cdot Krzj \quad (6')$$

(a: Weight of weighted average [0<a<1, e.g., a=1/256])

When the system is terminated, as shown in the following Expression (7), an average Krcl of the weighted averages Krcj (j=1, 2, . . . , n) of respective regions is calculated. The weighted average Krcl is stored as the impedance-correction-coefficient learned value Krl on the memory. Before calculating the weighted average Krcl, the number of impedance calculating times may be counted every region after the system is started until the system is terminated. If the counted number does not reach the predetermined number in a region, the region can be eliminated from target regions for average calculation.

$$Krcl = \Sigma Krcj/n \quad (7)$$

The impedance-correction-coefficient learned value Krl calculated by the above-mentioned processing is fed back to the remaining-capacity estimating unit 20 by the deterioration estimating unit 30. The remaining-capacity estimating unit 20 corrects the initial impedance Zi on the basis of the impedance-correction-coefficient learned value Krl as shown in the following Expression (8) to obtain the corrected impedance Zc. Then, the remaining capacity SOC is estimated with high accuracy using the corrected impedance Zc, which reflects a change in impedance, in addition to the basic parameters of the battery 10, i.e., the terminal voltage V, the current I, and the temperature T.

$$Zc = Zi \times Krl \quad (8)$$

As is well-known, the remaining capacity SOC of a battery can be obtained based on the integrated value of the discharge and charge current of the battery or the open circuit voltage Vo, which is obtained based on the impedance. Disadvantageously, as the battery deteriorates, the impedance increases. Accordingly, when battery deterioration occurs, the accuracy with which to estimate the remaining capacity is degraded. Therefore, a change in impedance is calculated and the obtained change is reflected in the estimated remaining capacity. Consequently, even if the battery deteriorates, the high accuracy with which to calculate the remaining capacity can be ensured.

Figure 2:
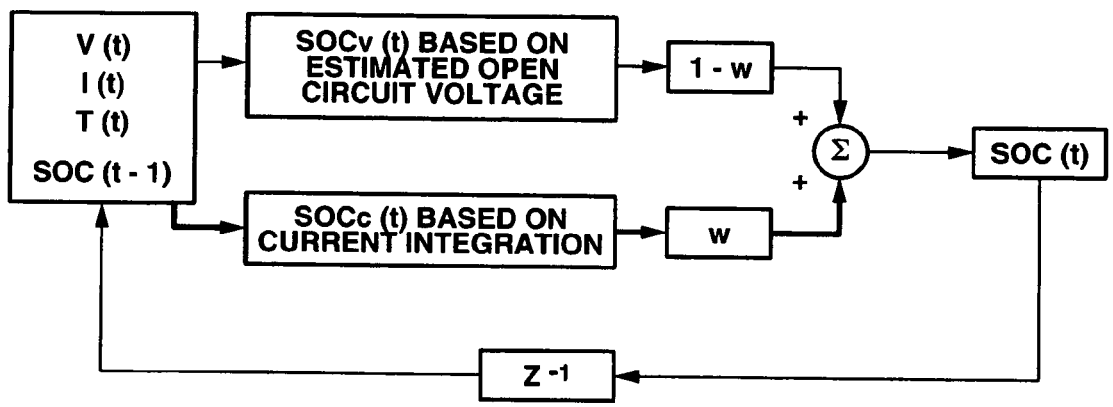
FIG. 2 is a block diagram of an algorithm for estimating the remaining capacity of a battery.

According to the present embodiment, the remaining capacity is calculated in accordance with an estimation algorithm shown in FIG. 2. The estimation algorithm uses measurable parameters in the battery 10, i.e., the terminal voltage V, the current I, and the temperature T. According to this algorithm, a remaining capacity SOCc(t) as a first remaining capacity based on current integration is calculated every predetermined time t by a function serving as first remaining-capacity calculating means. A remaining capacity SOCv(t) as a second remaining capacity based on the estimated battery open circuit voltage Vo is simultaneously calculated by a function serving as second remaining-capacity calculating means. The calculated remaining capacities SOCc(t) and SOCv(t) are respectively weighted and are then combined into the remaining capacity SOC(t) by a function serving as third remaining-capacity calculating means. The obtained remaining capacity SOC is set as the remaining capacity of the battery 10.

The remaining capacity SOCc based on the integration of the current I and the remaining capacity SOCv based on the estimated open circuit voltage Vo have advantages and disadvantages, respectively. The remaining capacity SOCc based on the current integration is not influenced by the load fluctuation in the battery caused by rush current but a cumulative error often occurs. Particularly, the error may increase under continuous high-load conditions. For the remaining capacity SOCv based on the estimated open circuit voltage Vo, the accurate value can be substantially obtained under normal conditions. When a load significantly varies for a short time, however, the value may fluctuate.

According to the present SOC estimation algorithm, therefore, the remaining capacity SOCc(t) based on the integration of the current I and the remaining capacity SOCv(t) obtained from the estimated battery open circuit voltage Vo are weighted using a weight (weight factor) w, which depends on the operating conditions of the battery 10 as needed, and the weighted remaining capacities are then combined into the remaining capacity SOC(t). Thus, the disadvantages of the remaining capacities SOCc(t) and SOCv(t) cancel each other out and the advantages thereof can be fully utilized. The weight w varies within the range from 0 to 1. The combined remaining capacity SOC(t) is expressed by the following Expression (9).

$$SOC(t) = w \cdot SOCc(t) + (1-w) \cdot SOCv(t) \quad (9)$$

It is necessary to determine the weight w using parameters capable of accurately representing the present operating conditions of the battery. For the parameters, the rate of change in current per unit time and the difference between the remaining capacities SOCc and SOCv can be used. The rate of change in current per unit time directly reflects the load fluctuation of the battery. However, the simple rate of change in current is influenced by a rapid change in current, i.e., a current spike.

According to the present embodiment, therefore, to prevent the influence by an instantaneous change in current, the rate of change in current subjected to processing related to the simple average, moving average, or weighted average of predetermined number of sample data is used. Particularly, in consideration of current delay, the weight w is determined using the moving average which can properly reflect hysteresis in a change in the state of charge or discharge of the battery.

The weight w is determined based on the moving average of the current I. When the moving average of the current I is large, the weight for the remaining capacity based on the current integration is increased and that for the remaining capacity based on the estimated open circuit voltage is reduced. Thus, the remaining capacity based on the current integration can accurately reflect the influence by the load fluctuation and the remaining capacity based on the open circuit voltage can be prevented from fluctuating. On the contrary, when the moving average of the current I is small, the weight for the remaining capacity based on the current integration is reduced and that for the remaining capacity based on the estimated open circuit voltage is increased. Consequently, the influence of the cumulative error caused by current integration can be avoided. The accurate remaining capacity can be calculated by estimating the open circuit voltage.

In other words, the moving average of the current I functions as a low-pass filter for a high frequency component in current. Due to filtering using the moving average, a current spike caused by a load fluctuation during driving can be eliminated without increasing delay. Thus, the state of the battery can be grasped with accuracy, the disadvantages of the remaining capacities SOCc and SOCv can cancel each other out, and the advantages thereof can be fully utilized. The accuracy with which to estimate the remaining capacity can be remarkably increased.

Further, as the features of the present SOC estimation algorithm, the internal conditions of the battery are electrochemically grasped based on a theory of battery, thus improving the accuracy with which to calculate the remaining capacity SOCv based on the open circuit voltage Vo of the battery. The calculation of the remaining capacities SOCc and SOCv according to the present estimation algorithm will now be described in detail.

First, the remaining capacity SOCc based on the current integration is obtained by using the remaining capacity SOC, combined using the weight w, as a base value and integrating the current I every predetermined time as shown in the following Expression (10).

$$SOCc(t)=SOC(t-1)-\int[100\eta I/Ah)+SD]dt/3600 \qquad (10)$$

η: Current efficiency
Ah: Current capacity (variable depending on temperature)
SD: Self-discharge rate In Expression (10), the current efficiency η and the self-discharge rate SD can be regarded as constants (for example, η=1, SD=0). The current capacity Ah depends on temperature. Therefore, in calculating the remaining capacity SOCc based on the current integration, the current capacity Ah is calculated by measuring a variation in cell capacity depending on temperature as a function.

Figure 3:
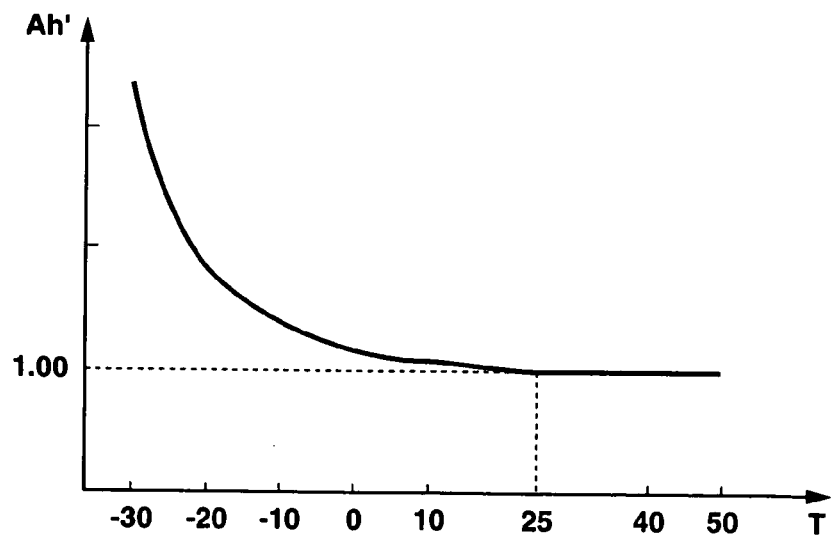
FIG. 3 is a diagram explaining a current capacity table using the temperature of the battery as a parameter.

FIG. 3 is a diagram explaining the current capacity. FIG. 3 uses the temperature T as a parameter and shows the capacity ratio Ah' of the current capacity to the rated capacity (e.g., rated current capacity on condition that the predetermined number of cells in one battery pack is set to a reference unit) as a predetermined reference. For the capacity ratio Ah' (=1.00) at a normal temperature (25° C.), as temperature becomes lower, the current capacity also becomes lower, so that the capacity ratio Ah' becomes larger. The current capacity Ah at every temperature T to be measured can be calculated using the capacity ratio Ah' obtained by reference to the current capacity table.

In this case, strictly, as the internal impedance of the battery becomes higher due to deterioration, the current capacity thereof becomes lower. Therefore, a current-capacity correction coefficient KA is introduced to correct the current capacity in accordance with the rate of increase in impedance. Preferably, the current capacity Ah obtained with reference to FIG. 3 is corrected using the current-capacity correction coefficient KA (Ah=Ah×KA).

Figure 4:
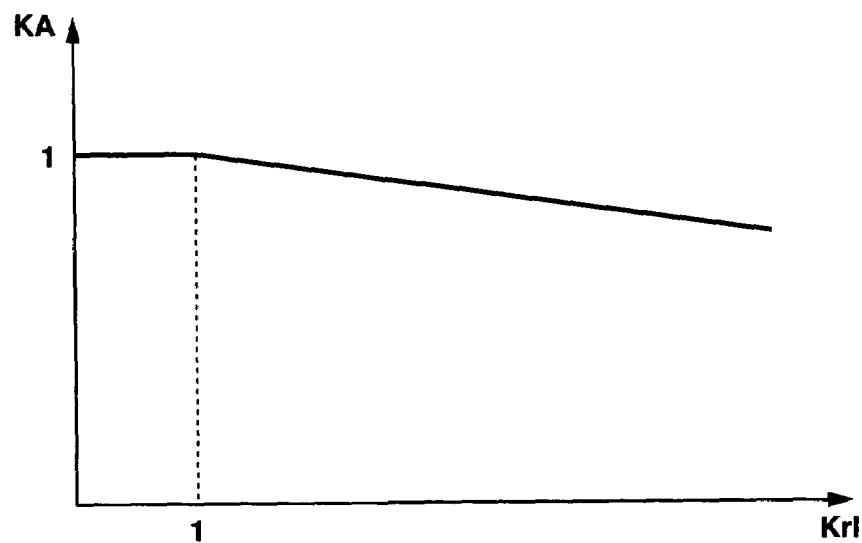
FIG. 4 is a diagram explaining a current-capacity correction coefficient table using an impedance-correction-coefficient learned value as a parameter.

The current-capacity correction coefficient KA can be determined using the impedance-correction-coefficient learned value Krl indicative of the rate of increase in impedance with reference to FIG. 4. That is, the current-capacity correction coefficient table stored the current-capacity correction coefficient KA using the impedance-correction-coefficient learned value Krl as a parameter may be used. Referring to FIG. 4, when the battery is new, Krl=1 and the current-capacity correction coefficient KA is set to 1, which is a reference value (KA=1). As the impedance-correction-coefficient learned value Krl becomes larger (the internal impedance of the battery becomes higher), the current-capacity correction coefficient KA becomes smaller.

Figure 5:
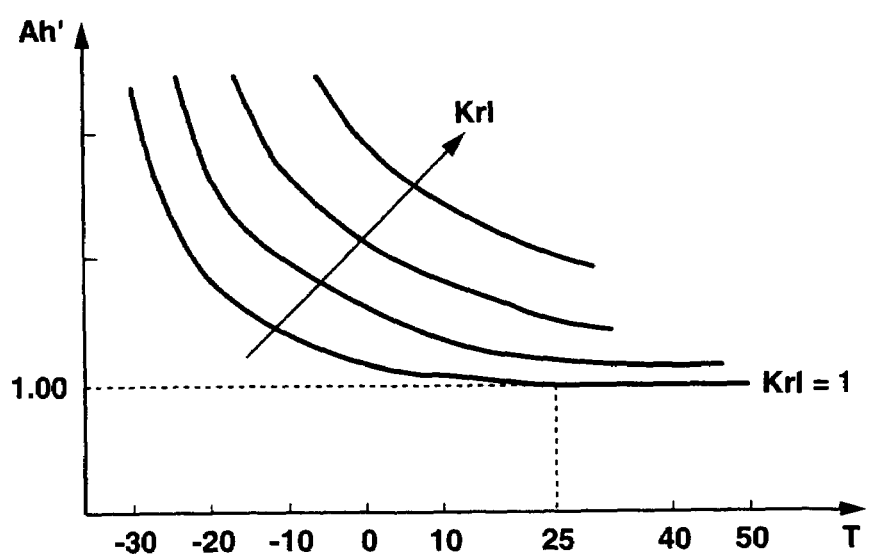
FIG. 5 is a diagram explaining a current capacity table using the battery temperature and the impedance-correction-coefficient learned value as parameters.

The current capacity table shown in FIG. 3 and the current-capacity correction coefficient table shown in FIG. 4 can be combined into one table, or diagram shown in FIG. 5. The current capacity Ah can also be calculated using the combined diagram using the battery temperature T and the impedance-correction-coefficient learned value Krl as parameters. In FIG. 5, the current capacity characteristic of FIG. 3 is used as a reference (Krl=1) and the characteristic using the impedance-correction-coefficient learned value Krl as a parameter is added. At the same temperature, as the impedance-correction-coefficient learned value Krl increases, the capacity ratio Ah' increases and the current capacity decreases.

As mentioned above, in calculating the remaining capacity SOCc(t) based on the current integration according to Expression (10), the current capacity is corrected according to the rate of increase in impedance of the battery. Thus, an error caused by current integration can be prevented and the accurate remaining capacity SOCc can be obtained.

Specifically, the calculation of the remaining capacity SOCc(t) using Expression (10) is performed by discrete time processing. The remaining capacity SOC(t−1) combined in the preceding calculation cycle is input as a base value (delay operator $Z^{-1}$ in FIG. 2) for current integration. Therefore, an error is not accumulated or diverged. Even when the initial value is remarkably different from a true value, the value converges on the true value after a predetermined lapse of time (e.g., several minutes).

On the other hand, in order to obtain the remaining capacity SOCv based on the estimated open circuit voltage Vo, the impedance of the battery 10 depending on the degree of deterioration of the battery 10 is obtained and the open circuit voltage Vo is then estimated using the obtained impedance. The impedance depending on the degree of deterioration can be obtained as the corrected impedance Zc (see Expression (8)) obtained by correcting the initial impedance Zi using the impedance-correction-coefficient learned value Krl. The corrected impedance Zc and the measured terminal voltage V and current I are applied to the foregoing Expression (1). An estimation of the open circuit voltage Vo is obtained using the following Expression (1').

$$Vo=I\times Zc+V \qquad (1')$$

In other words, in consideration of long-term use, when the open circuit voltage of the battery 10 is estimated using the impedance obtained in the initial state (undeteriorated state) of the battery 10, an estimation error increases. Disadvantageously, the accuracy of the remaining capacity based on the open circuit voltage Vo decreases. Therefore, the open circuit voltage Vo is obtained using the corrected impedance Zc which reflects the result of learning a change in impedance. Consequently, even if the battery 10 deteriorates, the accuracy with which to estimate the remaining capacity SOC can be maintained at a high level.

The corrected impedance Zc used in calculating the open circuit voltage Vo is obtained as follows: A table value Z, which is stored in an impedance table formed using an equivalent circuit model shown in FIG. 6, is used as the initial impedance Zi and this table value Z is corrected using the impedance-correction-coefficient learned value Krl.

Figures 6, 7, 9:
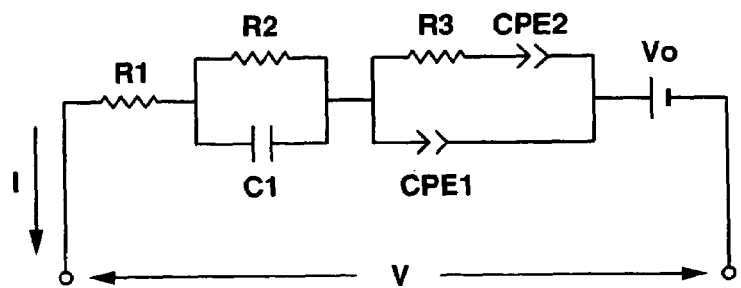
FIG. 6 is a circuit diagram showing an equivalent circuit model.
FIG. 7 is a table explaining the impedance table.
FIG. 9 is a table explaining a weight table.

In the equivalent circuit model in FIG. 6, parameters, i.e., resistances R1 to R3 and capacitances C1, CPE1, and CPE2 (CPE1 and CPE2 represent double layer capacitances) are connected in series and parallel. The parameters are determined by curve fitting using the well-known Cole-Cole plot according to the alternating current impedance method.

The impedance Z obtained from those parameters greatly depends on the temperature, the electrochemical reaction rate, the frequency component of charge and discharge current of the battery. Therefore, instead of the frequency component, the above-mentioned moving average of the current I per unit time is used as a parameter to determine the impedance Z. The impedance is measured based on the moving average of the current I and the temperature T to store data. After that, a table regarding the impedance is constructed on the basis of the temperature T and the moving average of the current I per unit time.

For example, when the current I is sampled every 0.1 seconds and the calculation period of current integration is 0.5 seconds, the moving average of the current I is obtained by moving average five data blocks. As mentioned above, the moving average of the current I is also used as the parameter to determine the weight w. The weight w and the impedance Z can be easily calculated using the moving average. Specifically, as temperature becomes lower, the internal impedance of the battery becomes higher, resulting in a decrease in the rate of change in current. Accordingly, the weight w and the impedance Z are determined using the corrected rate of change in current K∆I/∆t, obtained by temperature-compensating the moving average of the current I.

FIG. 7 shows an example of an impedance table which uses the corrected rate of change in current K∆I/∆t, obtained by temperature-compensating the rate of change in current ∆I/∆t (moving average of the current I per unit time), and the temperature T as parameters and stores data regarding the impedance Z. Specifically, at the same corrected rate of change in current K∆I/∆t, as the temperature T becomes lower, the impedance Z becomes higher. At the same temperature, as the corrected rate of change in current K∆I/∆t becomes smaller, the impedance Z becomes higher.

FIGS. 7 and 8, which will be described below, each show a set of data obtained in the range under normal conditions. Data obtained in other conditions is omitted.

After the open circuit voltage Vo is estimated, the remaining capacity SOCv is calculated based on the electrochemical relationship in the battery. Specifically, the relationship between the open circuit voltage Vo and the remaining capacity SOCv is expressed using the well-known Nernst's equation describing the relationship between the electrode potential and the activity of ion in an equilibrium state. Thus, the following Expression (11) is obtained.

$$Vo = E + [(Rg \cdot T/Ne \cdot F) \times \ln SOCv/(100-SOCv)] + Y \quad (11)$$

E: Normal electrode potential (E=3.745 in, e.g., the lithium-ion battery according to the present embodiment)

Rg: Gas constant (8.314 J/mol-K)

T: Temperature (absolute temperature K)

Ne: Ionic valence (Ne=1 in the lithium-ion battery according to the present embodiment)

F: Faraday constant (96485 C/mol)

In Expression (11), Y denotes a correction term and expresses the voltage-SOC characteristic at normal temperature as a function of SOC. When SOCv=X, Y can be expressed as a three-dimensional function of SOC as shown in the following Expression (12).

$$Y = -10^{-6} X^3 + 9 \cdot 10^{-5} X^2 + 0.013 X - 0.7311 \quad (12)$$

The strong correlation between the remaining capacity SOCv and not only the open circuit voltage Vo, but the temperature T is found from Expression (11). In this instance, the remaining capacity SOCv can be calculated using the open circuit voltage Vo and the temperature T as parameters and Expression (11). Actually, it is necessary to consider the charge and discharge characteristics of a battery to be used and the operating conditions thereof.

To grasp the actual state of the battery from the relationship represented by Expression (11), therefore, the SOC-Vo characteristic at normal temperature is used as a reference and a charging and discharging test or a simulation is performed in various temperature ranges to store actual measurement data. A table regarding the remaining capacity SOCv obtained using the open circuit voltage Vo and the temperature T as parameters is constructed based on the stored actual measurement data. The remaining capacity SOCv is obtained from this table. FIG. 8 shows an example of a remaining capacity table. In brief, as the temperature T and the open circuit voltage Vo become lower, the remaining capacity SOCv becomes smaller. As the temperature T and the open circuit voltage Vo become higher, the remaining capacity SOCv becomes larger.

After the remaining capacities SOCc and SOCv are calculated, as shown in the foregoing Expression (9), the remaining capacities SOCc and SOCv are weighted using the weight w determined by reference to a weight table and are then combined into the remaining capacity SOC. FIG. 9 shows an example of a weight table to determine the weight w. FIG. 9 is a one-dimensional table using the corrected rate of change in current K∆I/∆t as a parameter. Specifically, as the corrected rate of change in current K∆I/∆t becomes smaller, i.e., as the battery load fluctuation is smaller, the weight w is set lower, thus reducing the weight for the remaining capacity SOCc based on the current integration.

Figure 10:
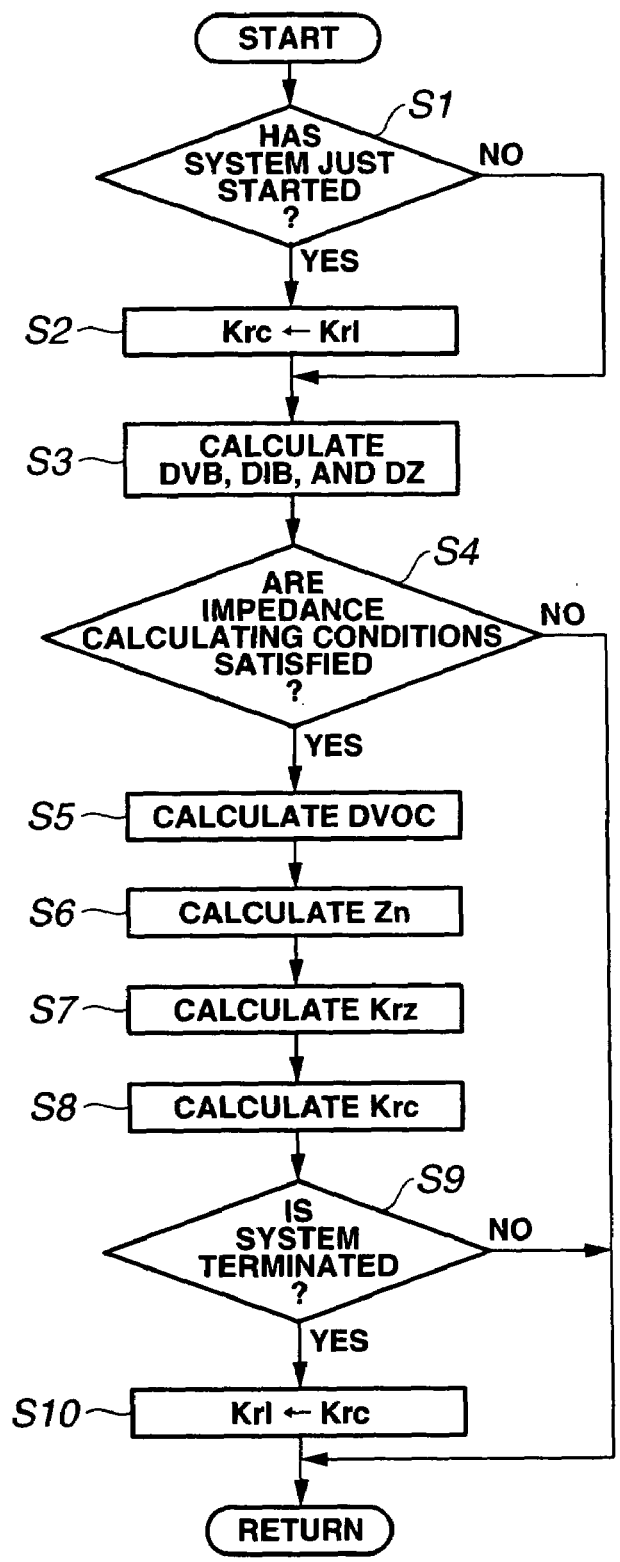
FIG. 10 is a flowchart of an impedance calculating process.

A process of calculating the impedance which varies as the battery deteriorates will now be described with reference to FIG. 10. FIG. 10 shows a flowchart of the impedance calculating process executed every predetermined time (predetermined period) while the system is running.

When the impedance calculating process starts, in step S1, whether the process is executed first time after the system starts is determined. If NO, the process skips to step S3. If YES, the process proceeds to step S2. In step S2, the impedance-correction-coefficient learned value Krl stored in the memory is set as the initial value Krc of this time weighted average (Krc←Krl). Then, the process proceeds to step S3.

In step S3, the terminal voltage V, the current I, and the corrected impedance Zc are read and the time variation in terminal voltage DVB, the time variation in current DIB, and the time variation in impedance DZ are calculated. In step S4, whether the impedance calculating conditions are satisfied is determined. As mentioned above, the impedance calculating conditions mean conditions where the temperature T of the battery 10 and the time variation in current DIB thereof are respectively within the predetermined ranges (e.g., the temperature T is in the range of 30 to 40° C., the time variation in current DIB is in the range of 40 to 60 A/s) and the impedance can be stably calculated.

In step S4, if the impedance calculating conditions are not satisfied, the process exits. If YES, the process proceeds to step S5. In step S5, the time variation in open circuit voltage DVOC is obtained. The time variation in open circuit voltage DVOC is obtained according to a function of DVOC=f(SOC, 1) or a table which is previously stored based on the remaining capacity SOC and the battery current I.

In step S6, the impedance Zn is obtained according to the foregoing Expression (4) using the battery current I, the time variation in open circuit voltage DVOC, the time variation in terminal voltage DVB, the time variation in current DIB, and the time variation in impedance DZ. Then, the process proceeds to step S7. In step S7, the ratio Krz of the impedance Zn obtained in step S6 to the initial impedance Zi read from the impedance table of FIG. 7 is calculated.

The process then proceeds to step S8. In step S8, the initial value Krc set upon system startup and the impedance ratio Krz are weighted and averaged, thus obtaining the weighted average Krc (see Expression (6)). In step S9, whether the system is terminated is determined. If the system is running, the process exits. Updating the weighted average Krc based on a change in impedance Zn is continued. If the system is terminated, the process proceeds to step S10. The value stored as the impedance-correction-coefficient learned value Krl on the memory is updated using the weighted average Krc obtained after the system is started until the system is terminated (Krl←Krc). Then, the process terminates.

In the case where a plurality of regions are set on the basis of the time variation in current DIB and the temperature T and the impedance is calculated every region, when the conditions where the time variation in current DIB and the temperature T are respectively within the predetermined ranges are satisfied every region in step S4, the impedance calculation control is started. In step S6, the impedance Znj is calculated every region. In step S7, the impedance ratio Krzj is calculated every region. In step S8, the weighted average Krcj is calculated every region. When the system is terminated, in step S10, the average Krcl of the weighted averages Krcj of the respective regions is obtained. The average Krcl is used as the impedance-correction-coefficient learned value Krl.

Figure 11:
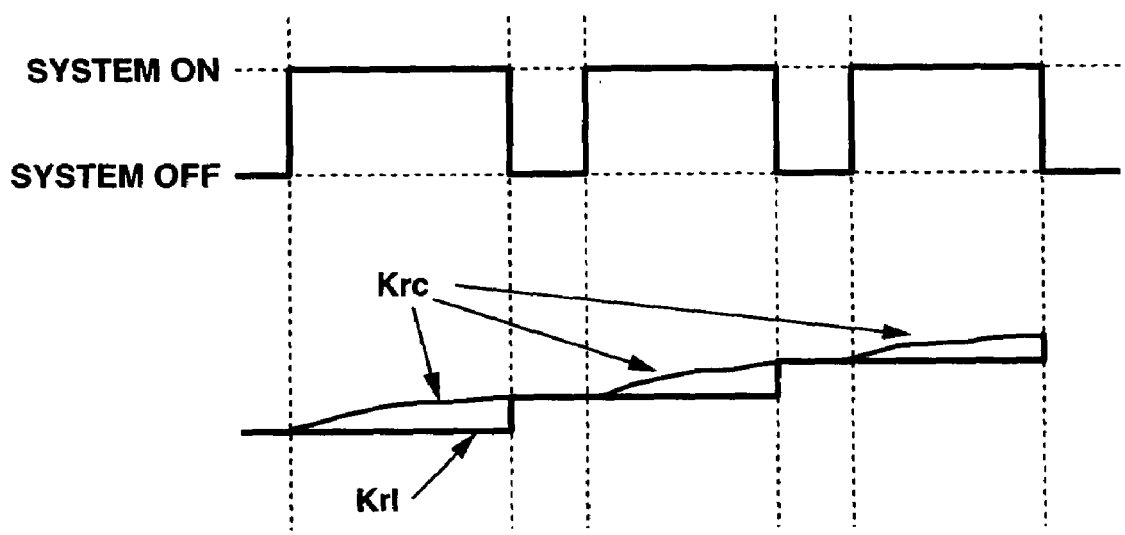
FIG. 11 is a diagram explaining an impedance learning state.

The above-mentioned process will now be described with reference to FIG. 11. When the system is started (ON), the impedance calculating process is executed every predetermined time (predetermined period) to check the impedance calculating conditions. Each time the impedance calculating conditions are satisfied and the impedance Zn is calculated, the obtained impedance Zn is compared to the initial impedance Zi and the impedance ratio Krz is subjected to weighting and averaging to obtain the weighted average Krc. When the system is terminated (OFF), the impedance-correction-coefficient learned value Krl is updated using the weighted average Krc obtained so far.

As mentioned above, in obtaining the remaining capacity SOCv based on the open circuit voltage Vo, the impedance-correction-coefficient learned value Krl is used as a correction value to compensate for battery deterioration. If the battery deteriorates, the remaining capacity SOCv can be obtained with high accuracy. In other words, according to the present embodiment, a change in impedance of the battery can be accurately grasped, so that the degree of deterioration of the battery can be estimated with accuracy. In addition, the change in impedance reflects parameters indicating the state of the battery, e.g., the remaining capacity. Thus, accurate battery management can be always ensured.

In the present invention, it is apparent that different embodiments in a wide range can be formed on the basis of this invention without departing from the spirit and scope of the invention. This invention is not restricted by any specific embodiment except being limited by the appended claims.

What is claimed is:

1. A battery management apparatus for grasping a change in impedance of a battery to reflect the battery management, the apparatus comprising:
   impedance calculating means for calculating the impedance of the battery using a terminal voltage of the battery, an open circuit voltage thereof, and a current thereof as parameters when variations in the current of the battery and a temperature thereof are respectively within predetermined ranges; and
   impedance correction value calculating means for comparing the impedance obtained by the impedance calculating means with an initial impedance previously obtained from the initial state of the battery to calculate a correction value depending on the degree of deterioration of the battery, and wherein the impedance calculating means further calculates the impedance at the present moment, and said impedance correction value calculating means calculates a correction value at the present moment by comparing the impedance at the present moment and said initial impedance, and a weighted average is set that is calculated by weighting and averaging the correction value at the present moment and a learned value that is representative of a previous correction value, and wherein the weighted average is set as an updated learned value, and the undated learned value is used as an updated correction value by said battery management apparatus.

2. The apparatus according to claim 1, wherein the impedance calculating means calculates the impedance of the battery on the basis of respective time variations in the parameters.

3. The apparatus according to claim 1, wherein the impedance correction value calculating means obtains the correction value on the basis of a weighted average obtained by weighting and averaging the ratio of the impedance obtained by the impedance calculating means and the initial impedance.

4. The apparatus according to claim 1, wherein the impedance correction value calculating means stores the weighted average as the learned value when processing terminates and uses the learned value as the correction value.

5. The apparatus according to claim 1, wherein the impedance calculating means sets regions on the basis of the variations in the current of the battery and the temperature thereof and calculates the impedance of the battery in respective regions.

6. The apparatus according to claim 5, wherein the impedance correction value calculating means obtains the correction values in respective regions on the basis of the weighted average obtained by weighting and averaging the ratio of the impedance obtained every region by the impedance calculating means and the initial impedance.

7. The apparatus according to claim 6, wherein the impedance correction value calculating means stores an average of the weighted averages of the respective regions as the learned value when processing terminates and uses the learned value as the correction value.

8. The apparatus according to claim 7, wherein the impedance correction value calculating means calculates the average of the weighted averages of the respective regions such that target regions exclude a region where the number of impedance calculating times is equal to or lower than a predetermined number.

9. The apparatus according to claim 1, further comprising:
   remaining capacity calculating means for correcting a current capacity read from a previously stored table using the correction value obtained by the impedance correction value calculating means and calculating a remaining capacity of the battery on the basis of the corrected current capacity.

10. The apparatus according to claim 1, further comprising:
    remaining capacity calculating means for correcting an impedance read from a previously stored table using the correction value obtained by the impedance correction value calculating means, estimating the open circuit voltage of the battery using the corrected impedance, and calculating a remaining capacity of the battery on the basis of the estimated open circuit voltage.

11. The apparatus according to claim 1, further comprising:
    first remaining capacity calculating means for correcting a current capacity read from a previously stored current capacity table using the correction value obtained by the impedance correction value calculating means and calculating a first remaining capacity based on the corrected current capacity and an integrated value of the charge and discharge current of the battery;
    second remaining capacity calculating means for correcting an impedance read from a previously stored impedance table using the correction value obtained by the impedance correction value calculating means and calculating a second remaining capacity based on the open circuit voltage of the battery estimated using the corrected impedance; and third remaining capacity calculating means for weighting the first remaining capacity obtained by the first remaining capacity calculating means and the second remaining capacity obtained by the second remaining capacity calculating means using a weight set according to an operating conditions of the battery and calculating a final remaining capacity of the battery by combining the weighted capacities.

12. The apparatus according to claim 11, wherein the weight set is determined according to a moving average of the current of the battery.

13. The apparatus according to claim 12, wherein the weight for the first remaining capacity increases as the moving average of the current increases.

14. The apparatus according to claim 12, wherein the weight for the second remaining capacity increases as the moving average of the current decreases.

* * * * *